United States Patent
Tseng et al.

(10) Patent No.: US 6,291,343 B1
(45) Date of Patent: *Sep. 18, 2001

(54) PLASMA ANNEALING OF SUBSTRATES TO IMPROVE ADHESION

(75) Inventors: Jennifer Tseng; Mei Chang, both of Saratoga; Ling Chen, Sunnyvale; David C. Smith, Santa Clara; Karl A. Littau, Palo Alto; Chyi Chern, Saratoga, all of CA (US); Marvin Liao, Woodbridge (SG)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/008,796

(22) Filed: Jan. 20, 1998

Related U.S. Application Data

(63) Continuation-in-part of application No. 08/810,221, filed on Feb. 28, 1997, which is a continuation-in-part of application No. 08/498,990, filed on Jul. 6, 1995, now abandoned, and a continuation-in-part of application No. 08/339,521, filed on Nov. 14, 1994, and a continuation-in-part of application No. 08/567,461, filed on Dec. 5, 1995.

(51) Int. Cl.[7] .............................. H01L 21/24; B05D 3/00; H05H 1/00
(52) U.S. Cl. ...................... 438/653; 438/643; 438/513; 438/681; 438/685; 427/532; 427/533
(58) Field of Search ..................... 438/643, 644, 438/648, 653, 654, 658, 656, 659, 685, 681, 513, 642, 652; 427/532, 533, 535, 537

(56) References Cited

U.S. PATENT DOCUMENTS

| 4,173,661 | 11/1979 | Bourdon | 427/39 |
| 4,480,010 | * 10/1984 | Sasanuma | 428/457 |

FOREIGN PATENT DOCUMENTS

| 0 397 131 A2 | 11/1990 | (EP) . | |
| 477990 | * 1/1992 | (EP) . | |
| 0 545 602 A1 | 6/1993 | (EP) . | |
| 0 630 989 A2 | 12/1994 | (EP) | C23C/16/44 |
| 0 678 903 A1 | 10/1995 | (EP) | H01L/21/00 |
| 0 720 214 A2 | 7/1996 | (EP) . | |
| 0 738 002 A2 | 10/1996 | (EP) . | |
| 0 776 991 A1 | 6/1997 | (EP) | C23C/16/56 |
| 0 840 363 A1 | 5/1998 | (EP) . | |
| WO 95/33865 | 12/1995 | (WO) . | |

OTHER PUBLICATIONS

Park et al. "A Novel Al–Reflow Process Using Surface Modification by the ECR Plasma Treatment and its Application to the 256Mbit DRAM" International Electron Devices Meeting, US, New York, IEEE, pp. 108–112, Dec. 11, 1994.

*Primary Examiner*—Charles Bowers
*Assistant Examiner*—Thannha Pham
(74) *Attorney, Agent, or Firm*—Thomason, Moser & Patterson, LLP

(57) ABSTRACT

A layer of material is formed on a substrate in a partially formed integrated circuit on a wafer. The substrate undergoes a plasma annealing, during which the substrate is bombarded with ions. The plasma annealing may be performed by exposing the substrate to plasma that is generated from a nitrogen containing gas which is infused with energy. After the substrate is plasma annealed, a layer of a refractory metal nitride is deposited on the substrate. The layer of refractory metal nitride is then bombarded with a first set of ions. The bombardment of the refractory metal by the first set of ions may be achieved by performing a plasma annealing. The refractory metal nitride may be further bombarded by a second set of ions.

24 Claims, 7 Drawing Sheets

U.S. PATENT DOCUMENTS

| | | | |
|---|---|---|---|
| 4,844,775 | * | 7/1989 | Keeble ................................ 156/643 |
| 5,017,403 | | 5/1991 | Pang et al. ............................. 427/39 |
| 5,127,988 | * | 7/1992 | Kawamura et al. ................. 156/643 |
| 5,202,280 | * | 4/1993 | Kamiyama et al. ................. 438/396 |
| 5,232,871 | * | 8/1993 | Huei-Min Ho ...................... 438/653 |
| 5,296,404 | * | 3/1994 | Akahori et al. ..................... 438/668 |
| 5,308,655 | * | 5/1994 | Eichman et al. ................. 427/248.1 |
| 5,312,774 | | 5/1994 | Nakamura et al. .................. 437/192 |
| 5,314,603 | | 5/1994 | Sugiyama et al. ................... 204/298 |
| 5,352,623 | * | 10/1994 | Kamiyama .......................... 438/396 |
| 5,451,258 | | 9/1995 | Hillman et al. ..................... 118/715 |
| 5,576,071 | * | 11/1996 | Sandhu ................................ 427/534 |
| 5,593,511 | | 1/1997 | Foster et al. ........................ 148/238 |

* cited by examiner ved TITA-
PLASMA ANNEALING OF SUBSTRATES TO IMPROVE ADHESION

CROSS-REFERENCE TO RELATED APPLICATIONS

This application is continuation-in-part of the following U.S. Patent Applications:

U.S. patent application Ser. No. 08/810,221, entitled CONSTRUCTION OF A FILM ON A SEMICONDUCTOR WAFER and filed on Feb. 28, 1997 which is a continuation-in-part of U.S. patent application Ser. No. 08/498,990, entitled BIASED PLASMA ANNEALING OF THIN FILMS and filed on Jul. 6, 1995 now abandoned and of U.S. patent application Ser. No. 08/339,521, IMPROVED TITANIUM NITRIDE LAYERS DEPOSITED BY CHEMICAL VAPOR DEPOSITION AND METHOD OF MAKING and filed on Nov. 14, 1994 and of U.S. patent application Ser. No. 08/567,461, entitled PLASMA ANNEALING OF THIN FILMS and filed on Dec. 5, 1995.

Each of the aforementioned related patent applications in hereby incorporated by reference.

BACKGROUND OF THE INVENTION

A. Field of the Invention

The present invention is directed toward the field of manufacturing integrated circuits.

B. Description of the Related Art

In the manufacture of integrated circuits, diffusion barriers are employed to inhibit the diffusion of metals into regions underlying the diffusion barrier. These underlying regions include transistor gates, capacitor dielectrics, semiconductor substrates, metal lines, and many other structures that appear in integrated circuits. The prevention of metal diffusion is important, because metal diffusion can cause highly resistive pockets to form in regions into which it diffuses. The formation of such resistive pockets can render an integrated circuit defective.

For example, when an electrode is being formed for a transistor's gate, a diffusion barrier is often formed between the gate and a metal that serves as the contact portion of the electrode. The diffusion barrier inhibits the diffusion of the metal into the gate, which may be composed of polysilicon. Diffusion barriers are also employed between the dielectric of a capacitor and the contact portion of the capacitor's electrode. The dielectric may be composed of a material such as tantalum pentoxide, while the electrode's contact portion consists of a metal, such as tungsten, titanium, aluminum or copper. The diffusion barrier prevents the diffusion of the metal into the dielectric. Otherwise, such a diffusion would render the capacitor inoperable.

Refractory metal nitrides have been employed as diffusion barriers. For example, titanium nitride has been employed to inhibit the diffusion of metals, such as copper and aluminum. However, titanium nitride's adhesion to certain surfaces, such as polysilicon and tantalum oxides, is not as high as is desired. Good adhesion is important to provide for the structural integrity of the integrated circuit being manufactured. Good adhesion also provides for better conductivity between the diffusion barrier and an underlying region.

Further, when titanium nitride is deposited on tantalum pentoxide, a reaction occurs. The oxygen from the tantalum pentoxide mixes with the titanium nitride and oxidizes the titanium nitride. This intermixing of the oxygen and the titanium nitride is undesirable, because the presence of oxygen raises the resistivity of the titanium nitride film.

Rapid thermal nitridation has been employed to improve the adhesion of titanium nitride to tantalum pentoxide and reduce the oxidation of titanium nitride. Before the titanium nitride is deposited, rapid thermal nitridation is performed on the tantalum pentoxide substrate to form tantalum oxynitride on the surface of the substrate. The titanium nitride is then deposited on the tantalum oxynitride to which it has better adhesion.

Currently, the rapid thermal nitridation of the tantalum pentoxide substrate and the deposition of titanium nitride cannot be carried out as in-situ operations in the same chamber. As a result, the wafer has to be placed in a rapid thermal nitridation chamber following the deposition of tantalum pentoxide and transferred to a titanium nitride deposition chamber after the rapid thermal nitridation is performed.

It is desirable to minimize the number of different processing chambers that are employed. This limits the number of chamber transfers that must be undergone by a wafer. Chamber transfers are undesirable, because they cause a wafer to be exposed to contaminants in the environment outside of the chamber. Such contaminants can render the wafer defective. Further, the wafer may be exposed to oxygen during transfers. The oxygen can then react with materials on the wafer's surface to increase the resistivity of the wafer's surface material to unacceptable levels.

Accordingly, it is desirable to provide for the formation of a refractory metal nitride film, such as titanium nitride, on a substrate, so that the refractory metal nitride has acceptable diffusion barrier properties and adhesion to the substrate. It is also desirable for any substrate treatment that is performed prior to the deposition of the refractory metal nitride to be carried out in the same chamber as the deposition of the refractory metal nitride.

SUMMARY OF THE INVENTION

In accordance with the present invention, a refractory metal nitride film is formed on an exposed substrate in a partially formed integrated circuit on a wafer so that the film adheres to the substrate. Further, the entire formation of the film may be performed in-situ in a single processing chamber.

In forming such a film, the substrate is plasma annealed prior to the deposition of any film materials. During the plasma annealing, the substrate is bombarded with ions. After the substrate is plasma annealed, a layer of refractory metal nitride is deposited on the substrate. In one embodiment of the present invention, the refractory metal nitride is titanium nitride. As a result of plasma annealing the substrate, there is a good adhesive bond between the substrate and the refractory metal nitride.

Next, the deposited refractory metal nitride undergoes a first plasma annealing, during which the refractory metal nitride is bombarded with a first set of ions. In embodiments of the present invention, the refractory metal nitride also undergoes a second plasma annealing after the first plasma annealing is completed. During the second plasma annealing, the refractory metal nitride is bombarded with a second set of ions. In embodiments of the present invention, the plasma annealing of the substrate, deposition of refractory metal nitride, and plasma annealing of the refractory metal nitride may all be performed in-situ in the same chamber.

When plasma annealing the substrate, the substrate is exposed to a plasma containing ions. The plasma is generated by providing a gas and energizing the gas with the energy generated with a radio frequency. In one embodiment of the present invention, the gas that is provided is a nitrogen gas. In further embodiments of the present invention, the gas may include a mixture of nitrogen and other elements such as hydrogen and helium.

BRIEF DESCRIPTION OF THE DRAWINGS

Further details of the present invention are explained with the help of the attached drawings in which.

DETAILED DESCRIPTION

Figure 1A:
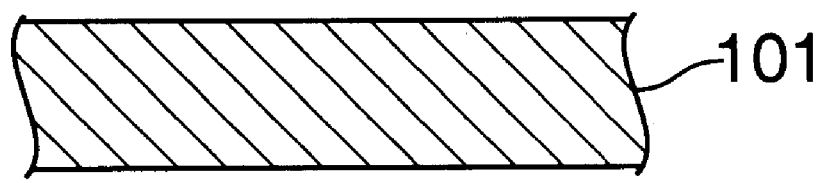
FIGS. 1(a)–1(d) illustrate the formation of a refractory metal nitride film in accordance with the present invention.

FIG. 1(a) illustrates a cross-sectional view of a substrate material 101 in a partially formed integrated circuit. A refractory metal nitride diffusion barrier is to be formed on the substrate 101. The substrate may be any one of a number of materials. For example, the substrate 101 may be polysilicon that forms a gate of a transistor or may alternatively be tantalum pentoxide that forms the dielectric of a capacitor. It should be recognized that the invention is not limited by the particular use or placement of the barrier layer.

Figure 1B:
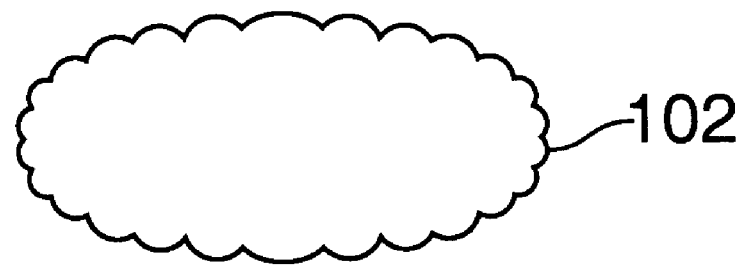
Figure 1B:
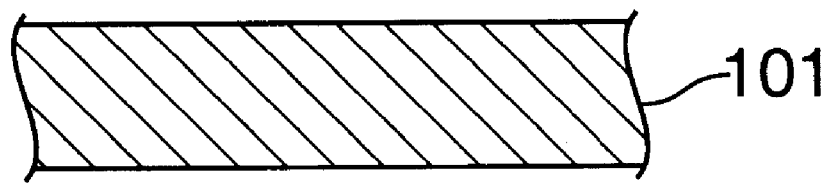

As shown in FIG. 1(b), the substrate 101 undergoes a plasma annealing in which the substrate 101 is treated with a plasma 102 to prepare the substrate 101 for the deposition of a refractory metal nitride. As a result of the plasma annealing, the refractory metal nitride adheres better to the substrate 101.

In performing the plasma annealing, a gas is provided and infused with energy to form the plasma 102. In order to form the plasma 102 in accordance with the present invention, the gas is excited using energy from a signal having a frequency in a range of 350 to 600 kilohertz ("Khz"). The power of the signal may be in a range of 300 to 1200 watts. The signal may be provided to the gas for a period of 10 to 300 seconds for generating and maintaining the plasma.

During the generation of the plasma 102, the substrate 101 obtains a self-bias voltage that results in ions in the plasma 102 being attracted to the substrate 101, so that the ions bombard the substrate 102. In one embodiment of the present invention, the temperature of the substrate 101 is set to be in a range of 300 to 475° C., and the plasma annealing is carried out in an environment with a pressure in the range of 0.3 to 10 Torr.

In accordance with the present invention, the gas used to form the plasma 102 may be any gas, but is preferably a non-oxygen-and-carbon containing gas such as nitrogen, ammonia, or argon. In one embodiment of the present invention, the gas is composed of nitrogen ($N_2$). In alternate embodiments of the present invention, the gas is composed of a mixture of nitrogen ($N_2$) and other elements such as hydrogen ($H_2$). Alternatively, the gas may be a mixture of nitrogen ($N_2$) and helium (He) or a mixture of nitrogen ($N_2$), hydrogen ($H_2$), and helium (He).

In each of the above described embodiments in which nitrogen is included in the gas, nitrogen ions are generated in the plasma 102. The nitrogen ions bombard the substrate 101. When the substrate 101 is tantalum pentoxide, the nitrogen ion bombardment results in the formation of a layer of tantalum oxynitride on the upper surface of the substrate 101. In accordance with the present invention, the tantalum oxynitride inhibits the oxidation of a refractory metal nitride diffusion barrier that is later deposited on the substrate 101.

Figure 1C:
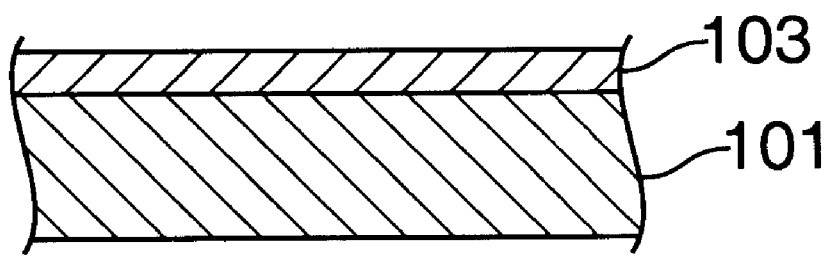

Once the substrate has been treated by the plasma 102, a refractory metal nitride material 103 is deposited on the upper surface of the substrate 101, as shown in FIG. 1(c). Refractory metal nitrides in the form $M_xN_y$ (where M may be titanium, zirconium, hafnium, tantalum, molybdenum, tungsten and other refractory metals; and x and y represent different quantitative combinations of metal and nitrogen) may be used as the refractory metal nitride material 103.

In accordance with the present invention, the refractory metal nitride 103 may be titanium nitride (TiN) that is deposited using chemical vapor deposition ("CVD"). The chemical vapor deposition of titanium nitride may be achieved through the use of a metallo-organic titanium compound. One such compound is tetrakis(dialkylamido) titanium (Ti($NR_2$)$_4$), wherein R at each occurrence independently is in an alkyl group, of, for example, 1–5 carbon atoms. It is common to use tetrakis(dimethylamido)titanium (TDMAT), which has the formula Ti(N($CH_3$)$_2$)$_4$. A carrier gas, such as helium, argon, nitrogen, or hydrogen brings the compound into a CVD chamber, so that it may be infused with energy. The energy may be generated through a thermal heat source, in the case of thermal CVD, or a signal source providing a signal with a frequency, in the case of plasma enhanced CVD. The energized chemical vapor reacts with a wafer's surface to form a thin layer of material on the wafer.

When the TDMAT chemical vapor is used, a titanium nitride film is deposited on the wafer's surface. To facilitate the deposition of the titanium nitride as the refractory metal nitride 103, the substrate 101 temperature is set to be in the range of 340–390° C., and the pressure of the environment in which the deposition is being performed is set to be in the range of 0.5 to 2.0 Torr. A conventional CVD process for depositing titanium nitride that may be employed in embodiments of the present invention is disclosed in U.S. Pat. No. 5,246,881 issued to Sandhu, et al.

As a result of the plasma treatment that was provided to the substrate 101, as described with reference to FIG. 1(b), the adhesion of the titanium nitride 103 to the substrate 101 is improved. In the case of the substrate 101 being either polysilicon or tantalum pentoxide, the adhesion of the titanium nitride is significantly increased over the adhesion that results when no substrate plasma annealing is performed.

Further, in the case where substrate 101 represents tantalum pentoxide, the oxidation of the titanium nitride 103 is significantly reduced. As described above, the plasma annealing of a tantalum pentoxide substrate results in the formation of tantalum oxynitride on the upper surface of the substrate 101. The tantalum oxynitride isolates the titanium nitride 103 from the oxygen in the tantalum pentoxide substrate 101. As a result, the oxygen content of the titanium nitride 103 is reduced, thereby lowering the resistivity of the titanium nitride 103.

Figure 2A:
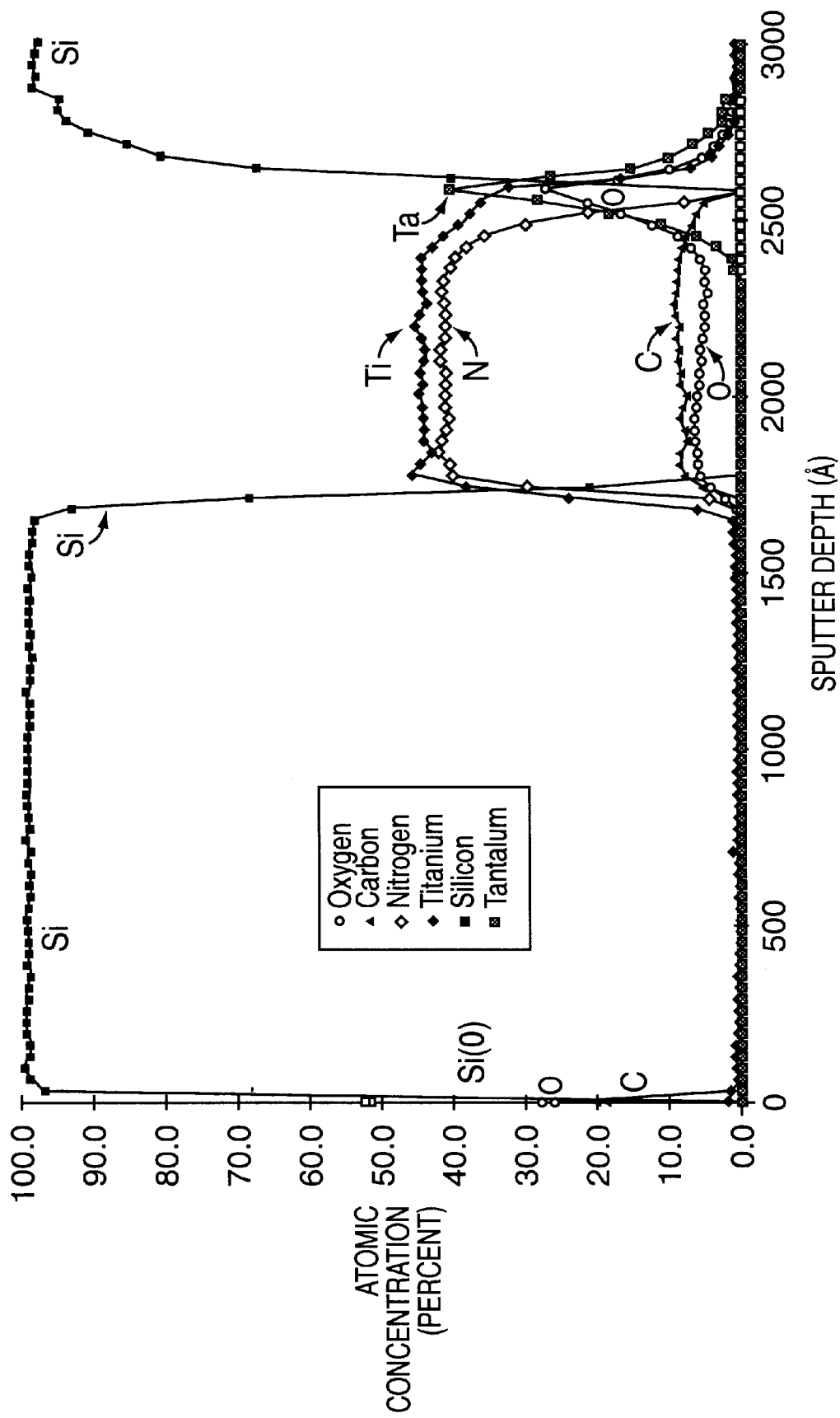
FIG. 2(a) illustrates an Auger depth profile of a structure having titanium nitride deposited on a substrate that has not been plasma annealed.
Figure 2B:
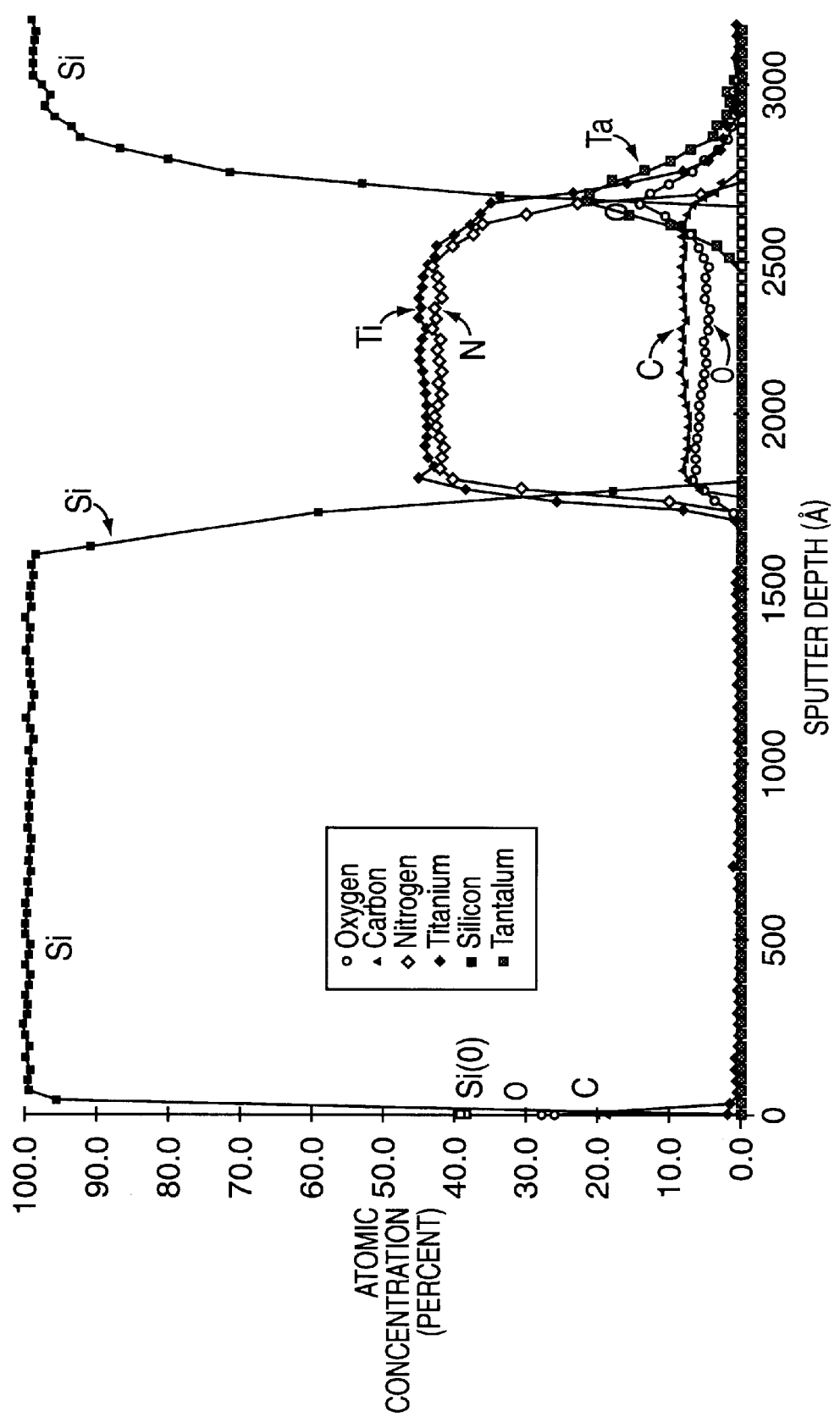
FIG. 2(b) illustrates an Auger depth profile of a structure having titanium nitride deposited on a substrate that has been plasma annealed in accordance with the present invention.

FIG. 2(a) shows an Auger profile of a structure in which an 800 to 1000 Å layer of titanium nitride is deposited on a layer of tantalum pentoxide that has not been plasma annealed. FIG. 2(b) shows an Auger depth profile of a structure in which an 800 to 1000 Å layer of titanium nitride is deposited on a layer of tantalum pentoxide that has been plasma annealed in accordance with the present invention. As can be seen by comparing FIGS. 2(a) and 2(b), the content of oxygen is significantly lower in the structure in FIG. 2(b) at depths in the range of 2500 Å to 2750 Å, where the junction between the titanium nitride and tantalum pentoxide is formed. This represents the presence of the isolating tantalum oxynitride that is formed by the plasma annealing.

The tantalum pentoxide represented in FIG. 2(b) was plasma annealed for 30 seconds. The plasma was formed using a gas consisting of $N_2$. The gas was provided at a flow rate of 100–560 SCCM, and energized by a signal having a frequency of 350 KHz and a power of approximately 750 watts.

A CVD deposited layer of titanium nitride 103 can contain significant amounts of carbon. This causes the resulting layer of titanium nitride 103 to be chemically reactive. Consequently, oxygen is absorbed into the titanium nitride film 103, when the film 103 is exposed to air or other oxygen containing gases. Since the oxygen absorption is uncontrolled, the stability of the titanium nitride 103 is impaired and the resistivity of the titanium nitride 103 is adversely increased. This may result in the reliability of devices formed in the integrated circuit being poor.

After exposure to air, the sheet resistivity of a CVD deposited titanium nitride film can increase to values of about 10,000 $\mu\Omega$-cm up to about 100,000 $\mu\Omega$-cm. This is highly undesirable when the deposited titanium nitride is employed as a diffusion barrier in either an electrode structure or interconnect structure, such as a plug. A resistivity on the order of about 600 $\mu\Omega$-cm or less is desirable.

Figure 1D:
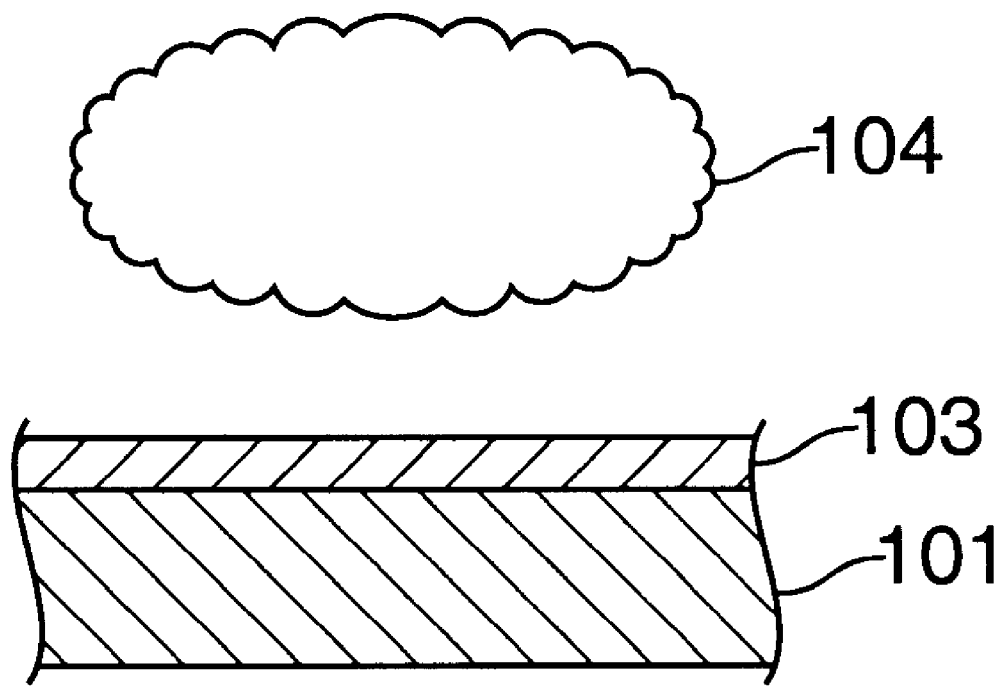

As shown in FIG. 1(d), the CVD deposited refractory metal nitride 103, such as titanium nitride, may be plasma annealed to reduce its resistivity. Either a single plasma annealing or sequential plasma annealing may be employed to reduce the resistivity of the film 103. U.S. patent application Ser. No. 08/810,221, entitled *Construction of a Film on a Semiconductor Wafer* and filed on Feb. 28, 1997, and incorporated herein by reference, discloses both single and sequential plasma annealing processes that may be employed to reduce the resistivity of the refractory metal nitride 103, such as titanium nitride.

The foregoing process is accomplished in a single CVD chamber such as that described in U.S. patent application Ser. No. 08/680,724, entitled *Components Peripheral to the Pedestal in the Gas Flow Path within a Chemical Vapor Deposition Chamber,* by Zhao, et al., filed on Jul. 12, 1996, and incorporated herein by reference. This form of chamber is manufactured by Applied Materials, Inc. of Santa Clara, Calif. under the trade name TxZ Chamber which may be employed to perform the substrate 101 plasma annealing, deposition of refractory metal nitride 103, and plasma annealing of refractory metal nitride 103. Alternative chambers that may be employed to perform plasma annealing in accordance with the present invention are disclosed in U.S. patent application Ser. No. 08/810,221, entitled *Construction of a Film on a Semiconductor Wafer* and filed on Feb. 28, 1997 and incorporated herein by reference. When more than one chamber is employed to perform the substrate plasma annealing, CVD deposition, and refractory metal nitride plasma annealing, a vacuum is preferably maintained during the transfer of the wafer from a CVD chamber to an annealing chamber.

Figure 3:
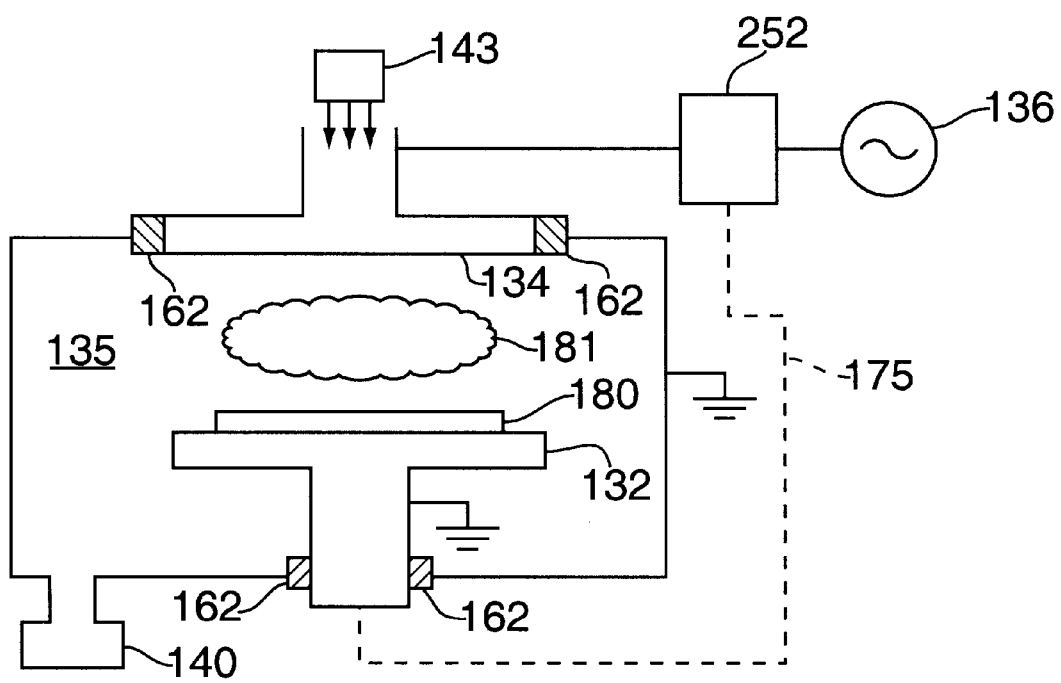
FIG. 3 illustrates a chamber for forming a refractory metal nitride film in accordance with the present invention.

FIG. 3 schematically depicts a CVD chamber such as the TxZ Chamber. The chamber 130 includes a pressure control unit 140 (e.g., vacuum pump) for setting the pressure in the processing chamber and exhausting reaction byproducts from the processing chamber 135. The chamber 130 also includes isolators 162, which electrically isolate the walls of the processing chamber 135 from the showerhead 134 and wafer support 132. A gas panel 143 is provided in the chamber 130 for supplying gases to the showerhead 134. Although an embodiment of the present invention will be further described with reference to the chamber 130 shown in FIG. 3, one with ordinary skill in the art will recognize that the described plasma annealing and deposition may be carried out in a number of different chambers, as described above.

In order to treat a substrate in accordance with the present invention, a wafer 180 in which the substrate resides and is exposed is placed on the chamber's wafer support 132 and spaced about 0.3 to 0.8 inches, preferably 0.6 to 0.7 inches, from the showerhead 134. A plasma 181 with energetic ions is obtained by applying energy to a nitrogen ($N_2$) gas that is introduced into the processing chamber 135 through the showerhead 134. Although a nitrogen gas is preferred, one or more other gases such as hydrogen, helium, argon or ammonia could be used to plasma treat the substrate.

The gas panel 143 supplies the nitrogen gas to the showerhead 134 with a flow rate in the range of 100 to 1,000 sccm. Energy is supplied to the gas from the signal source 136 that is coupled to the showerhead 134 (and alternatively to the pedestal 132). A signal having a frequency in the range of 350 to 600 KHz and a power in the range of 300 to 1,200 watts is supplied.

With the showerhead 134 powered, i.e., top power, and the wafer support 132 and processing chamber 135 walls grounded, the showerhead is driven with 700 to 1000 watts and a DC self-bias voltage between −100 to −200 volts between the wafer 180 and ground is induced on the wafer 180. This is sufficient to attract nitrogen ions from the plasma 181 to impact the exposed substrate on the wafer 180. During the plasma annealing, the pressure in the processing chamber 135 is set to be in the range of 0.3 to 10 Torr, with the preferred chamber pressure being in the range of 0.5–2.0 Torr. The temperature of the wafer 180, including the substrate, is set to be in a range of 300 to 475° C. The plasma annealing is generally performed for a time in the range of 15 to 300 seconds, with the preferred plasma annealing time being in the range of 20–40 seconds.

Although top power is preferred, the plasma can be generated by applying the high frequency signal to the pedestal 132 only, i.e., bottom power, or simultaneously to the pedestal and showerhead. These optional configurations are represented by dashed path 175 coupling the RF power supply 136 through the matching network 252 to the pedestal 132.

Once the plasma annealing is completed, the gases in the processing chamber 135 are purged by the pressure control unit 140. When the substrate is tantalum pentoxide, the nitrogen ion bombardment, as described above, results in the formation of tantalum oxynitride on the upper surface of the exposed tantalum pentoxide substrate on the wafer 180.

In an alternative embodiment of the present invention, a gaseous mixture of nitrogen ($N_2$) and hydrogen ($H_2$) may be substituted for the nitrogen gas during the plasma annealing of the substrate on the wafer 180. When employing the chamber 130 shown in FIG. 3, the wafer 180 may be placed on the wafer support 132 and spaced about 0.3 to 0.8 inches, preferably 0.6 to 0.7 inches, from the showerhead 134.

A gas comprised of a 3:1 mixture of nitrogen and hydrogen is introduced into the processing chamber 135 via the showerhead 134. The mixture of nitrogen and hydrogen is provided by the gas panel 143 through the showerhead 134 with a nitrogen flow rate of about 300 sccm. The signal source 136 then supplies a signal to the showerhead 134 through the matching network 252. The signal provided by the signal source 136 has a power in the range of 300 to 1,200 watts, with 700 to 1,000 watts being preferred and a frequency in the range of 300 to 600 kHz. Although the above-described gas mixture has a nitrogen to hydrogen ratio of 3:1, any ratio between 5:1 and 1:5 may be used.

A plasma containing positively-charged nitrogen and hydrogen ions forms under the influence of the power supplied to the showerhead 134. The plasma is typically maintained for a time in the range of 15 to 300 seconds, and when top power alone is used, the preferred time is 10 to 35 seconds. As described above, the processing chamber walls and the wafer support 132 are grounded. The showerhead 134 acquires a negative bias between −150 to −450 volts, typically −400 volts. The wafer 180, including the substrate, self-biases to acquire a negative bias of between −100 to −200 volts, typically −150 volts. This negative bias voltage remains approximately constant during a bombardment period.

During the bombardment period, positively charged ions from the plasma are accelerated by the voltage gradient into the surface of the substrate on the wafer 180. This causes the ions to bombard the wafer surface, penetrating to a depth of 50 to 100 Å. Energetic neutral atomic particles from the plasma also may bombard the wafer.

Once the substrate has been treated by the plasma 181, a layer of a refractory metal nitride diffusion barrier material 182 is deposited on the upper surface of the wafer 180.

The deposition of titanium nitride will be described to illustrate the deposition of refractory metal nitride 182, as an example of one embodiment of the present invention. In accordance with the present invention, the titanium nitride 182 is deposited using chemical vapor deposition.

A carrier gas mixture of nitrogen ($N_2$) and helium (He) brings a TDMAT compound into the processing chamber 135 through the showerhead 134, so that the TDMAT may be infused with energy. Both the carrier gas mixture and TDMAT compound are provided to the showerhead 134 by the gas panel 143. The nitrogen and helium gases are each provided at a flow rate in the range of 100 to 1,500 sccm, and the TDMAT is provided at a flow rate in the range of 100–1,000 sccm.

In the processing chamber 135, the wafer 180 is set to a temperature in the range of 300–390° C., and the pressure control unit 140 sets the pressure in the processing chamber 135 to be in the range of 0.5 to 2.0 Torr. The TDMAT reacts with the wafer's heated surface to form a thin layer of titanium nitride 182 on the upper surface of the wafer 180, including the substrate. The deposition process is maintained for a period of time in the range of 50 to 900 seconds. Once the deposition is completed, the resulting byproducts are purged from the processing chamber 135 by the pressure control unit 140.

As a result of the plasma annealing that was performed on the exposed substrate on the wafer 180, the titanium nitride's adhesion to the plasma annealed substrate is improved. The improved adhesion of the titanium nitride is superior to the adhesion that results with a substrate that has not been plasma annealed. If the plasma annealed substrate is tantalum pentoxide, the titanium nitride also has a reduced level of oxidation, due the isolation provided by the tantalum oxynitride formed on the upper surface of the substrate.

To improve the resistivity of the titanium nitride layer, the film may be annealed as described in U.S. patent application Ser. No. 08/810,221, entitled *Construction of a Film on a Semiconductor Wafer*, filed Feb. 28, 1997, wherein a plasma of nitrogen, hydrogen, ammonia, or some combination thereof is ignited in the chamber to bombard the film with the energetic ions. As a result of the ion bombardment, compression of the deposited material occurs and the thickness may be reduced by 20 to 50%. The reduction depends upon the temperature of the wafer 180 and the plasma treatment time and energy. Further layers of titanium nitride may be successively deposited and plasma annealed to obtain a diffusion barrier film with a desired thickness.

After the annealing is completed, the resulting plasma annealed titanium nitride film 182 exhibits many improved properties. Oxygen content is reduced, thereby causing oxygen to comprise less than 1% of the deposited and annealed material. The density of the film increases from less than 3.1 grams per cubic centimeter (g\cm$^3$) to about 3.9 g\cm$^3$. The fraction of carbon incorporated into the deposited film is reduced by 25% or more, so that the carbon comprises 3% of the deposited film.

Changes in the structure of the film occur, and the film's resistivity is reduced from pre-treatment levels of approximately 10,000 $\mu\Omega$-cm to as low as 150 $\mu\Omega$-cm. When the annealed film is exposed to oxygen, air, or water vapor, oxygen is absorbed to a much lesser extent than if the deposited film were not annealed. The plasma annealing causes replacement of carbon and nitrogen in the as-deposited film with nitrogen from the plasma.

Figure 4:
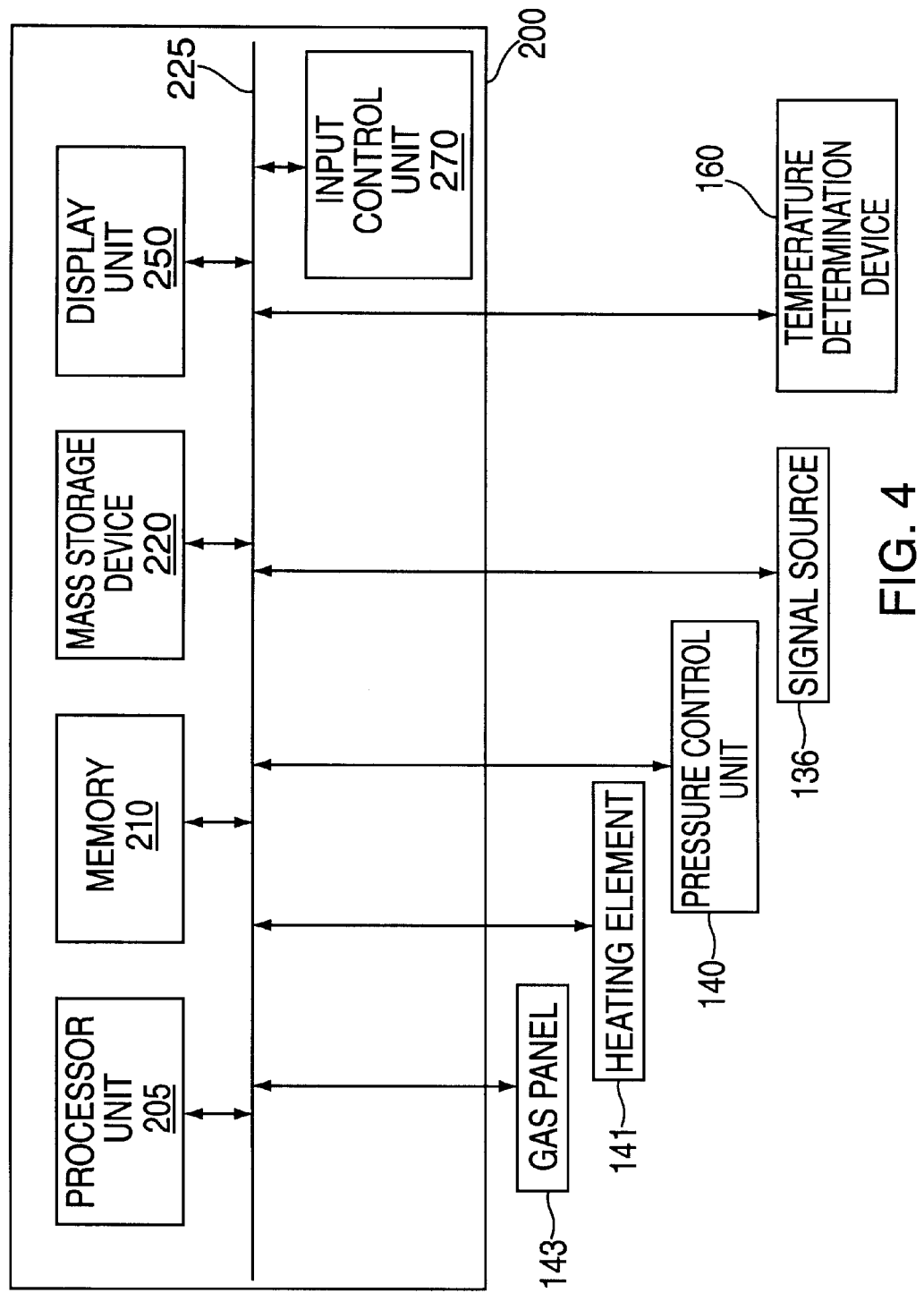
FIG. 4 illustrates a control unit for controlling a chamber that is used for forming a refractory metal nitride film on a substrate in accordance with the present invention.

In accordance with the present invention, titanium nitride may be deposited in a chamber that is controlled by a processor-based control unit. FIG. 4 illustrates a control unit 200 that may be employed in such a capacity. The control unit 200 includes a processor unit 205, a memory 210, a mass storage device 220, an input control unit 270, and a display unit 250 which are all coupled to a control unit bus 225.

The processor unit 205 may be a microprocessor or other engine that is capable of executing instructions stored in a memory. The memory 210 may be comprised of a hard disk drive, random access memory ("RAM"), read-only memory ("ROM"), a combination of RAM and ROM, or other memory. The memory 210 contains instructions that the processor unit 205 executes to facilitate the performance of the above-mentioned process steps for plasma annealing a substrate on a wafer, depositing a refractory metal nitride, and plasma annealing the refractory metal nitride in accordance with the present invention. The instructions in the memory 210 may be in the form of program code. The program code may conform to any one of a number of different programming languages. For example the program code may be written in C+, C++, BASIC, Pascal, or a number of other languages.

The mass storage device 220 stores data and instructions and retrieves data and instructions from a processor readable storage medium, such as a magnetic disk or magnetic tape. For example, the mass storage device 220 may be a hard disk drive, floppy disk drive, tape drive, optical disk drive, or compact disk read only memory ("CD-ROM") drive. The mass storage device 220 stores and retrieves the instructions in response to directions that it receives from the processor unit 205. Data and instructions that are stored and retrieved by the mass storage unit 220 may be employed by the processor unit 205 for performing substrate plasma annealing, refractory metal nitride deposition, and refractory metal nitride plasma annealing. The data and instructions may first be retrieved by the mass storage device 220 from a medium and then transferred to the memory 210 for use by the processor unit 205.

The display unit 250 provides information to a chamber operator in the from of graphical displays and alphanumeric characters under the control of the processor unit 205. The input control unit 270 couples a data input device, such as a keyboard, mouse, or light pen, to the control unit 200 to provide for the receipt of a chamber operator's inputs.

The control unit bus 225 provides for the transfer of data and control signals between all the devices that are coupled to the control unit bus 225. Although the control unit bus 225 is displayed as a single bus that directly connects to the devices in the control unit 200, the control unit bus 225 may be a collection of buses. For example, the display unit 250, input control unit 270 and mass storage device 220 may be coupled to an input-output peripheral bus, while the processor unit 205 and memory 210 are coupled to a local processor bus. The local processor bus and input-output peripheral bus may be coupled together to form the control unit bus 225.

The control unit 200 is coupled to the elements of a chamber, such as the chamber shown in FIG. 3, for performing substrate plasma annealing, refractory metal nitride deposition, and refractory metal nitride plasma annealing in accordance with the present invention. Each of the chamber's elements may be coupled to the control unit bus 225 to facilitate communication between the control unit 200 and the respective element. These chamber elements, as set forth with reference to FIG. 3, include the gas panel 143, a heating element 141, such as a resistive coil, pressure control unit 140, signal source 136, and temperature determination device.

The control unit 200 provides signals to the chamber elements that cause the elements to perform the operations described above for the process steps of substrate plasma annealing, refractory metal nitride deposition, and refractory metal nitride plasma annealing in accordance with the present invention. The control unit 200 may also receive signals from these elements to determine how to proceed in controlling these process steps. For example, the control unit 200 receives signals from the temperature termination device 160 to determine the amount of heat that the heating element 141 should provide to set a desired temperature of a wafer.

Figure 5:
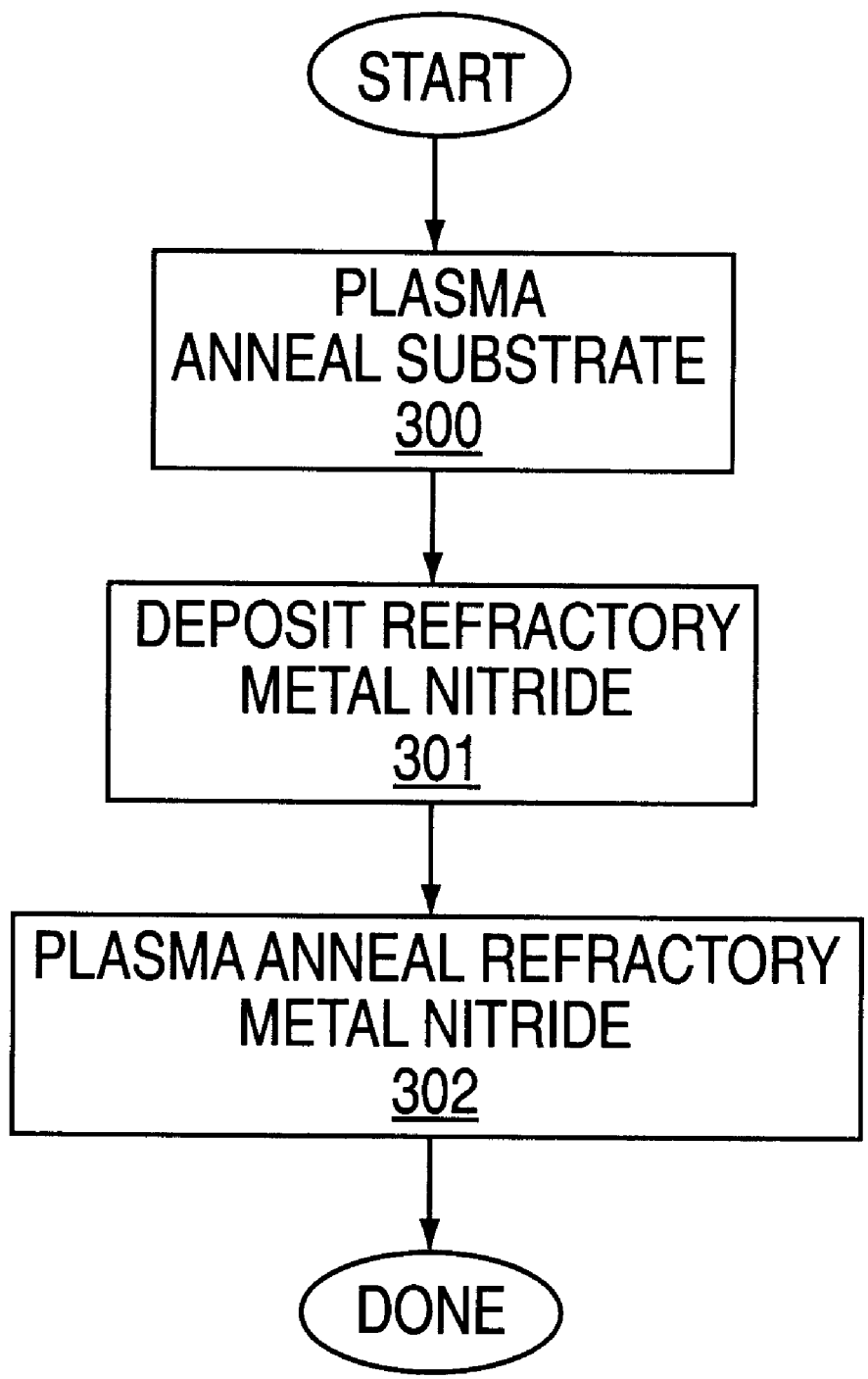
FIG. 5 illustrates a sequence of operations performed by the control unit shown in FIG. 4 in accordance with the present invention.

FIG. 5 illustrates a sequence of process steps that may be performed by the processor unit 205 in response to program code instructions that it receives from the memory 210. Upon initiating the formation of a refractory metal nitride film in accordance with the present invention, a plasma annealing of an exposed substrate on a wafer is performed in step 300.

Accordingly, the processor unit 205 retrieves instructions from the memory 210, which cause the processor unit to direct the operation of chamber 130 elements to cause the substrate on which the refractory metal nitride film is to be formed to be plasma annealed. For example, the processor unit 205 instructs the pressure control unit 140, heating element 141, gas panel 143, temperature determination device 160, and signal source 136 to operate to plasma anneal the substrate as described above with reference to FIG. 1(b).

Following the plasma annealing of the substrate (step 300) a deposition step 301 is performed. In the deposition step 301, the processor unit 205 executes instructions retrieved from the memory 210. The execution of these instructions results in the elements of the chamber 130 being operated, as described with reference to FIG. 1(c), to deposit a layer of a refractory metal nitride, such as titanium nitride, on the plasma annealed substrate. For example, the processor unit 205 controls the pressure control unit 140, heating element 141, gas panel 143, and temperature determination device 160 to operate to deposit a layer of refractory metal nitride on the plasma annealed substrate as described above with reference to FIG. 1(c).

Once the deposition of refractory metal nitride (step 301) is completed, instructions retrieved from the memory 210 instruct the processor unit 205 to cause the elements of the chamber 130 to perform a plasma annealing of the refractory metal nitride in step 302, such as one of the plasma annealing procedures described above with reference to FIG. 1(d). The plasma annealing may include plasma annealing with either nitrogen, a mixture of nitrogen and hydrogen, or a mixture of nitrogen, hydrogen, and another gas such as argon. Alternatively, the plasma annealing step 302 may cause a sequential annealing to be executed as described above. In performing the plasma annealing in step 302, the processor unit 205 instructs the pressure control unit 140, heating element 141, gas panel 143, temperature determination device 160, and signal source 136 to operate to carry out a plasma annealing of the refractory metal nitride as described above with reference to FIG. 1(d).

Although the present invention has been described in terms of specific exemplary embodiments, it will be appreciated that various modifications and alterations might be made by those skilled in the art without departing from the spirit and scope of the invention as specified in the following claims.

What is claimed is:

1. A method for forming a layer of material on a substrate comprising the steps of:
   (a) exposing said substrate to a first plasma containing ions;
   (b) following said step (a), depositing a layer of a refractory metal nitride on said substrate; and
   (c) exposing said layer of refractory metal nitride to a second plasma containing ions.

2. The method of claim 1, wherein said step (a) further comprises the step of:
   electrically biasing said substrate to cause said ions from said first plasma to impact said substrate.

3. The method of claim 2, wherein said first plasma of said step (a) is generated from a first gas composition by providing a signal having a frequency to a first electrode on a first side of said substrate.

4. The method of claim 3, wherein said frequency is in a range of 350 to 600 kilohertz and said signal has a power in a range of 300 to 1,200 volts.

5. The method of claim 4, wherein said wafer is set to a temperature in a range of 300° C. to 475° C.

6. The method of claim 1, wherein said step (a) is performed in a processing chamber at a pressure in a range of 0.3 to 10 Torr.

7. The method of claim 3, wherein said first gas composition contains at least one gas selected from the group consisting of nitrogen, hydrogen, ammonia, argon and helium.

8. The method of claim 7, wherein said substrate is tantalum pentoxide.

9. The method of claim 7, wherein said substrate is polysilicon.

10. The method of claim 1, wherein said step (a), said step (b), and said step (c) are all performed in a single processing chamber and said substrate remains inside the single processing chamber between beginning said step (a) and completion of said step (c).

11. The method of claim 1, wherein said step (b) is performed using chemical vapor deposition.

12. The method of claim 11, wherein said layer of refractory metal nitride is deposited by thermal decomposition of a metallo-organic compound.

13. The method of claim 12, wherein said refractory metal nitride is titanium nitride.

14. The method of claim 1, wherein said step (c) further comprises the step of:

electrically biasing said refractory metal nitride to cause said ions from said second plasma to impact said substrate.

15. The method of claim 14, wherein said second plasma is generated from a second gas composition by providing a signal having a frequency to a first electrode on a first side of said substrate.

16. The method of claim 15, wherein said second gas composition contains at least one gas selected from the group consisting of nitrogen, hydrogen, argon, helium, and ammonia.

17. The method of claim 16, wherein said refractory metal nitride is titanium nitride.

18. The method of claim 1, further comprising the step of:

(d) following said step (c), exposing said layer of refractory metal nitride to a third plasma containing ions, wherein said third plasma is different from said second plasma.

19. The method of claim 18, wherein said step (c) further comprises the step of:

electrically biasing said refractory metal nitride to cause said ions from said second plasma to impact said layer of refractory metal nitride, and wherein said step (d) further comprises the step of:

electrically biasing said refractory metal nitride to cause said ions from said third plasma to impact said layer of refractory metal nitride.

20. The method of claim 19, wherein said second plasma is generated from a second gas composition by providing a first signal having a first frequency to a first electrode on a first side of said substrate, and said third plasma is generated from a third gas composition by providing a second signal having a second frequency to said first electrode on said first side of said substrate.

21. The method of claim 20, wherein said second gas composition contains at least one gas selected from the group consisting of nitrogen, hydrogen, argon, helium, and ammonia.

22. The method of claim 20, wherein said third gas composition contains at least one gas selected from the group consisting of nitrogen, helium, neon, and argon.

23. The method of claim of claim 18, wherein said step(b) is performed using chemical vapor deposition.

24. The method of claim 23, wherein said layer of refractory metal nitride is titanium nitride.

* * * * *

UNITED STATES PATENT AND TRADEMARK OFFICE
CERTIFICATE OF CORRECTION

PATENT NO.    : 6,291,343 B1
DATED         : September 18, 2001
INVENTOR(S)   : Tseng et al.

It is certified that error appears in the above-identified patent and that said Letters Patent is hereby corrected as shown below:

Column 1,
Line 21, please replace "in" with -- is --.

Column 8,
Line 5, please replace "due the" with -- due to the --.

Column 9,
Line 12, please replace "from" with -- form --.

Column 10,
Line 55, please replace "substrate" with -- wafer --.

Column 11,
Line 24, please replace "substrate" with -- wafer --.

Signed and Sealed this

Thirteenth Day of August, 2002

*Attest:*

*Attesting Officer*

JAMES E. ROGAN
*Director of the United States Patent and Trademark Office*